US006567318B2

(12) United States Patent
Bedarida et al.

(10) Patent No.: US 6,567,318 B2
(45) Date of Patent: May 20, 2003

(54) CONTROL CIRCUIT FOR AN OUTPUT DRIVING STAGE OF AN INTEGRATED CIRCUIT

(75) Inventors: Lorenzo Bedarida, Vimercate (IT); Luca Vandi, Firenze (IT); Carlo Lisi, Milan (IT); Andrea Bellini, Fontevivo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/991,493

(22) Filed: Nov. 21, 2001

(65) Prior Publication Data

US 2002/0093374 A1 Jul. 18, 2002

(51) Int. Cl.[7] ........ G11C 16/04

(52) U.S. Cl. ........ 365/189.05; 365/189.07; 365/189.09; 365/210; 365/230.08; 326/30

(58) Field of Search ........ 365/189.05, 189.07, 365/189.09, 210, 230.08; 326/30; 327/512, 513

(56) References Cited

U.S. PATENT DOCUMENTS 6,141,258 A * 10/2000 Kawasumi ........ 365/189.05
6,307,424 B1 * 10/2001 Lee ........ 327/530
6,469,539 B2 * 10/2002 Kim ........ 326/30

* cited by examiner

*Primary Examiner*—Son T. Dinh
*Assistant Examiner*—Nam Nguyen
(74) *Attorney, Agent, or Firm*—Allen, Dyer, Doppelt, Milbrath & Gilchrist, P.A.; Lisa K. Jorgenson

(57) ABSTRACT

An impedance control circuit controls the impedance of an integrated output driving stage. The integrated output driving stage includes at least one enabling/disabling transistor and at least one driving transistor. The impedance control circuit includes a variable impedance circuit having an impedance that varies with the temperature in correlation with the impedance of the output driving stage. A control circuit is connected to the variable impedance circuit for generating at least one enabling/disabling signal for the at least one enabling/disabling transistor based upon a control signal correlated to the impedance of the variable impedance circuit. The impedance control circuit also includes a current generating circuit for applying to the variable impedance circuit a current which remains substantially stable as the temperature varies.

41 Claims, 6 Drawing Sheets

CONTROL CIRCUIT FOR AN OUTPUT DRIVING STAGE OF AN INTEGRATED CIRCUIT

FIELD OF THE INVENTION

The present invention relates to integrated circuits, and more particularly, to a control circuit for controlling the impedance of an output driving stage of an integrated circuit.

BACKGROUND OF THE INVENTION

In general, integrated circuits such as semiconductor memories, for example, are provided with output driving stages or output buffers which make it possible to obtain output signals (e.g., signals containing the digital data being read by the memory) with voltage or current levels suitable to drive the components which, in the electronic system, follow the integrated circuit.

In the case of semiconductor memories, the output buffers are typically of the inverting type, and each one comprises a plurality of pull-up transistors and a plurality of pull-down transistors respectively connected in parallel. For example, in the case of CMOS technology integrated circuits, the pull-up and pull-down transistors can be metal oxide semiconductor field effect transistors (MOSFETs) of the P-channel and N-channel type, respectively.

It is known that data transfer from a first integrated circuit to a second integrated circuit, for example, from a semiconductor memory such as a Flash memory to a receiving device such as a microprocessor, requires an impedance matching between the output buffer and the data line. The data line includes the bus along which data are carried. In fact, in non-matching conditions, reflections along the bus data line delay data transfer to the receiving device.

For this reason, the number and dimension characteristics of the pull-down and pull-up transistors in the output buffers are chosen in such a way as to satisfy the impedance matching. However, due to the fact that the parameter characteristics of the transistors used in the output buffers depend on temperature, and as this varies, the resistivity of the output buffers may also vary causing the matching conditions to worsen.

To compensate for these variations in the resistivity, conventional output buffers use pull-up and pull-down transistors which can be enabled selectively by enabling/disabling signals generated by a special control circuit. In this way, the configuration of the transistors enabled inside the output buffer can be modified by the control circuit in such a way as to maintain the impedance matching so that it is unchanged with the temperature.

Circuits to control impedance of the output buffers which use a group of control transistors connected in parallel, whose impedance is correlated to that of the output buffer and is variable with the temperature in correlation with the variations in the output buffer impedance, are well known. Furthermore, the control circuits use a reference circuit component, such as a resistor, whose impedance is stable with temperature and is proportional to that of the data line to which the output buffer is to be connected. A special control circuit, on the basis of a signal deriving from the control transistors and a signal deriving from the reference element, detects the presence of a non-matching situation and generates the pull-up and pull-down transistor enabling/disabling signals in such a way as to restore the matching condition.

It should be noted that conventional control circuits may present different implementation characteristics but, in any case, they require the use of a reference circuit component which remains stable in varying temperatures. The circuit component is of the discrete type and, therefore, has the disadvantage that it cannot be integrated onto the same chip as the output buffer.

SUMMARY OF THE INVENTION

In view of the foregoing background, an object of the present invention is to manufacture a circuit to control the impedance of an output driving stage which avoids the use of discrete type circuit components and which can, therefore, be fully integrated onto the same chip that includes the driving circuit.

This and other objects, advantages and features according to the present invention are provided by an output driving stage impedance control circuit of an integrated circuit which comprises a plurality of driving transistors comprising at least one enabling/disabling transistor.

The control circuit comprises variable impedance means whose impedance varies with the temperature in correlation with the impedance of the output driving stage, and control means connected to the variable impedance means such as to generate a first signal for enabling/disabling the at least one transistor according to a control signal correlated to the impedance of the variable impedance means.

The control circuit further comprises current generation means to inject into the variable impedance means a current which is substantially stable with the temperature.

BRIEF DESCRIPTION OF THE DRAWINGS

The characteristics and advantages of this invention will appear evident from the detailed description of a preferred embodiment, given purely as a non-limiting example and made with the help of the enclosed drawings, in which.

DETAILED DESCRIPTION OF THE PREFERRED EMBODIMENTS

Figure 1:
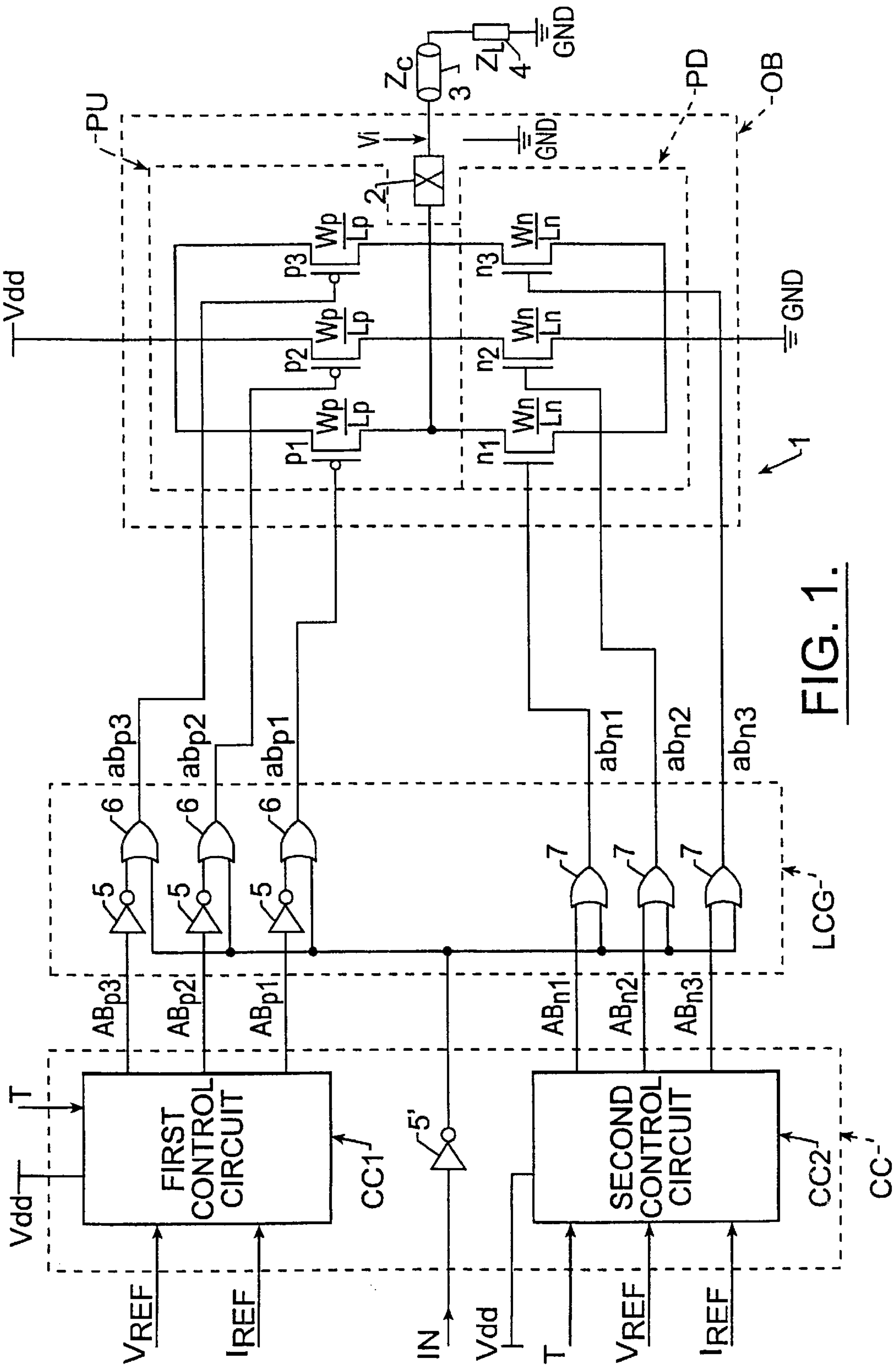
FIG. 1 is a schematic diagram of an output driving stage with controlled impedance according to the invention.

FIG. 1 shows a possible embodiment of a controlled impedance output driving circuit 1 in accordance with the invention, suitable to be used at the output of an integrated circuit. The circuit 1 comprises an input IN for an input signal, a control circuit CC, a logical gate circuit LGC, an output driving stage or output buffer OB, and a terminal or output pad 2 for an output signal.

For example, the circuit 1 is suitable to be used at the output of a non-volatile memory, such as a Flash memory. In this case the circuit 1 is provided on the output of a non-volatile memory, and the data input IN contains a bit of a data word read in the memory which must be made available at the output.

For example, a high voltage level signal corresponding to a logic 1 can be fed to the data input IN, or a low voltage level signal corresponding to a logic 0 can be fed to the data input IN. In the example given in FIG. 1, a signal having a logic level equal to the 1 present at the input IN is made available in operating conditions at the terminal 2.

Furthermore, FIG. 1 shows the supply terminals of the circuit 1 to which a supply voltage $V_{dd}$ is applied. For example, the supply voltage $V_{dd}$ can be equal to approximately 5 V, 3 V or 1.8 V.

Terminal 2 of the circuit 1 is connected by a data line 3, having a characteristic impedance $Z_c$, to a receiving device 4 as shown in FIG. 1, with an impedance load $Z_L$ connected to the data line 3 and to a ground terminal or ground GND. In particular, the data line 3 is a schematic representation of a strip on a printed circuit board to connect the output buffer OB to the receiving device 4. Typically, the characteristic impedance $Z_c$ of the data line 3 is equal to about 50 ohms.

The receiving device 4 can, for example, be a microprocessor input circuit or another integrated circuit (not shown). Since MOS technology integrated circuits are involved, the behavior in static conditions of the receiving device 4 is such that it can be assimilated to an open circuit.

The circuit 1 according to the invention, during the switching stage from one level to another of the output signal at terminal 2, enables generation of a voltage edge $V_i$ incident to the data line 3 with an amplitude substantially equal to $V_{dd}/2$. As will be evident to those skilled in the art, to the incident voltage edge $V_i$ corresponds a switching edge on the receiving device 4 with amplitude $V_L$ substantially equal to the following:

$$V_L=2V_i=V_{dd} \tag{1}$$

This insures that switching of the receiving device 4 takes place in only one passage.

The above mentioned relation between the incident voltage $V_i$ and the voltage $V_L$ present on the receiving device 4 is equivalent to an impedance matching of the circuit with distributed parameters comprising the output buffer OB, the data line 3 and the impedance load $Z_L$.

The impedance matching corresponds to rendering, in the desired operating point of the circuit, the resistance $R_0$ of the output buffer OB and the characteristic impedance $Z_c$ of the line substantially coincident, i.e., $R_o=Z_c$. Representing graphically the characteristic current-voltage curve I–V, which describes the behavior of the output buffer OB and the load line corresponding to the impedance Zc of the data line 3, the matching condition corresponds to sizing the output buffer OB in such a way that the characteristic curve intersects the load line at a point of voltage $V_{dd}/2$ and of current $I_M$ equal to $I_M=V_{dd}/2Z_C$.

It should be noted that in conditions of non-matching, the propagation of a signal output by the circuit 1 along the data line 3 is delayed and, in particular, if the resistance of the output buffer $R_0$ is lower than the characteristic impedance of the line $Z_c$, excessive delays are produced. However, if $R_0$ is greater than $Z_c$, the signal setting in steady conditions takes place in several passages.

In greater detail, the output buffer OB comprises a pull-up circuit PU and a pull-down circuit PD, coupled to the terminal 2 of the driving circuit 1. The pull-up circuit PU comprises a plurality of pull-up transistors or pull-up drivers. In the example, three P-channel MOSFETs $p_1$, $p_2$, $p_3$, for example, are coupled in parallel and are supplied with the voltage $V_{dd}$. The voltage $V_{dd}$ is applied to the source terminal of each pull-up driver $p_1$–$p_3$ while the respective drain terminals are connected to the terminal 2 of the circuit 1.

In the example given in FIG. 1, the pull-up drivers $p_1$–$p_3$ present the same aspect ratio value, in other words, the ratio between the width $W_p$ and the length $L_p$ of their respective conduction channels. In particular, the pull-up drivers $p_1$–$p_3$ present the same resistivity value.

In the same way, the pull-down circuit PD comprises a plurality of pull-down driving transistors or pull-down drivers. In the example, there are three N-channel MOSFETs $n_1$, $n_2$, $n_3$, for example, coupled in parallel. The drain terminals of the pull-down drivers $n_1$–$n_3$ are coupled to the drain terminals of the pull-up drivers $p_1$–$p_3$, and therefore to terminal 2, while the source terminals of the drivers $n_1$–$n_3$ are coupled to GND ground.

Analogous to the pull-up drivers $p_1$–$p_3$, the pull-down drivers $n_1$–$n_3$ present the same aspect ratio value, in other words the ratio between the width $W_p$ and the length $L_p$ of their respective conduction channels and, in particular, the pull-down drivers present the same resistivity value.

Preferably, each pull-down driver $n_1$–$n_3$ has a resistivity value substantially equal to that of a similar pull-up driver $p_1$–$p_3$. The pull-up drivers $p_1$–$p_3$ and the pull-down drivers $n_1$–$n_3$ are enabled for operation, in other words for conduction, from enabling/disabling signals $ab_{p1}$–$ab_{p3}$ and $ab_{n1}$–$ab_{n3}$ respectively, applied to the respective gate terminals.

The control circuit CC comprises a first control circuit CC1 to control the pull-up circuit PU, and a second control circuit CC2 to control the pull-down circuit PD.

The first (second) control circuit CC1 (CC2) is fed, in addition to the voltage $V_{dd}$, a reference voltage $V_{REF}$ and a reference current $I_{REF}$ substantially stable as the temperature T varies and as the supply voltage $V_{dd}$ varies.

For example, the voltage $V_{REF}$ is generated by a circuit of the bandgap type produced with well-known techniques and thus will not be described. Furthermore, the reference current $I_{REF}$ can be obtained by using any conventional technique, such as a technique which uses a bandgap type source. For example, a source of current which remains stable as the temperature and the supply voltage varies and is suitable to be used in this invention is described in U.S. Pat. No. 5,103,159.

It should be observed that the circuit for generation of the reference voltage $V_{REF}$ and the circuit for generation of the reference current $I_{REF}$ can be integrated onto the same chip that includes the output buffer OB. Furthermore, a conventional chip comprising a non-volatile memory, such as a Flash memory, normally comprises a circuit for the generation of a reference voltage and current which remains stable as the temperature and supply voltage varies and are used, for example, to supply loading pump booster circuits. In this case, the current $I_{REF}$ and the voltage $V_{REF}$ can be advantageously derived from the circuit present in the chip.

The first (second) control circuit CC1 (CC2), on the basis of the temperature T and the voltage $V_{dd}$, is suited to supply three output signals $AB_{p1}$, $AB_{p2}$, $AB_{p3}$, ($AB_{n1}$, $AB_{n2}$, $AB_{n3}$). The signals $AB_{p1}$, $AB_{p2}$, $AB_{p3}$, ($AB_{n1}$, $AB_{n2}$, $AB_{n3}$) are used to generate the above mentioned enabling/disabling signals $ab_{p1}$–$ab_{p3}$ ($ab_{n1}$–$ab_{n3}$) of the pull-up drivers $p_1$–$p_3$ (pull-down drivers $n_1$–$n_3$).

Output of the first control circuit CC1 and output of the second control circuit CC2 are connected to a logic gate circuit LGC. In particular, the logic gate circuit LGC comprises three logic gates 6 of the OR type. The first inputs are connected by the inverters 5 to the output signals $AB_{p1}$, $AB_{p2}$, $AB_{p3}$ of the first control circuit CC1, and second inputs are connected to the input IN by an inverter 5'. An output of the logic gates 6 are connected to the terminals of the gates of the pull-up drivers $p_1$–$p_3$ to supply the enabling/disabling signals $ab_{p1}$–$ab_{p3}$ to the terminals.

Moreover, the logic gate circuit LGC comprises three logic gates 7 of the AND type. A first input is connected to the output of the second control circuit CC2 relative to signals $AB_{n1}$, $AB_{n2}$, $AB_{n3}$, and a second input is connected by an inverter 5' to the input IN. At the output, the logic gates 7 are respectively connected to the terminals of the gates of the pull-down drivers $n_1$–$n_3$ to supply the enabling/disabling signals $ab_{n1}$–$ab_{n3}$ to the terminals.

Figure 2A:
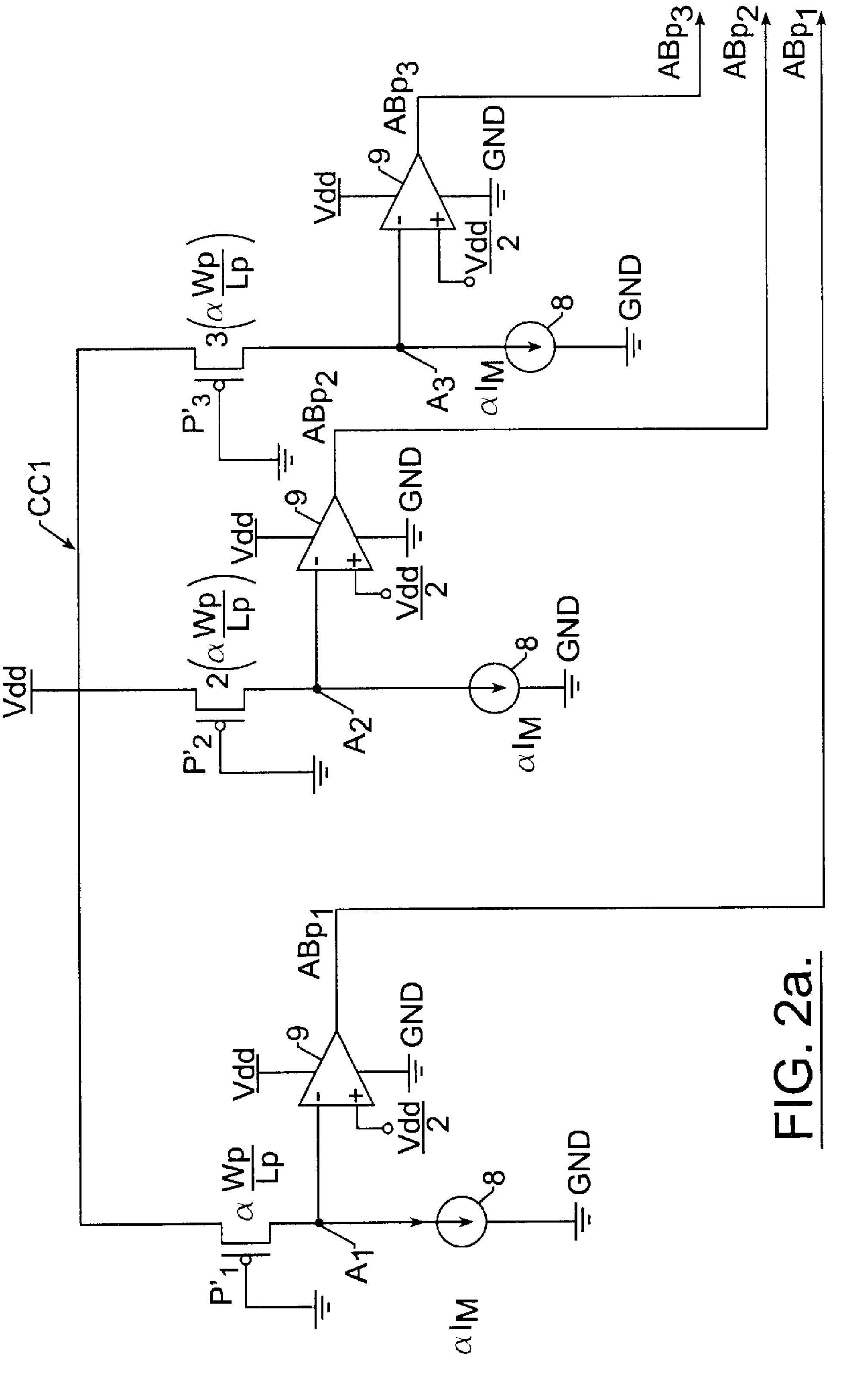
FIG. 2*a* is a circuit diagram of a first control circuit which can be used in the output driving stage illustrated in FIG. 1.
Figure 2B:
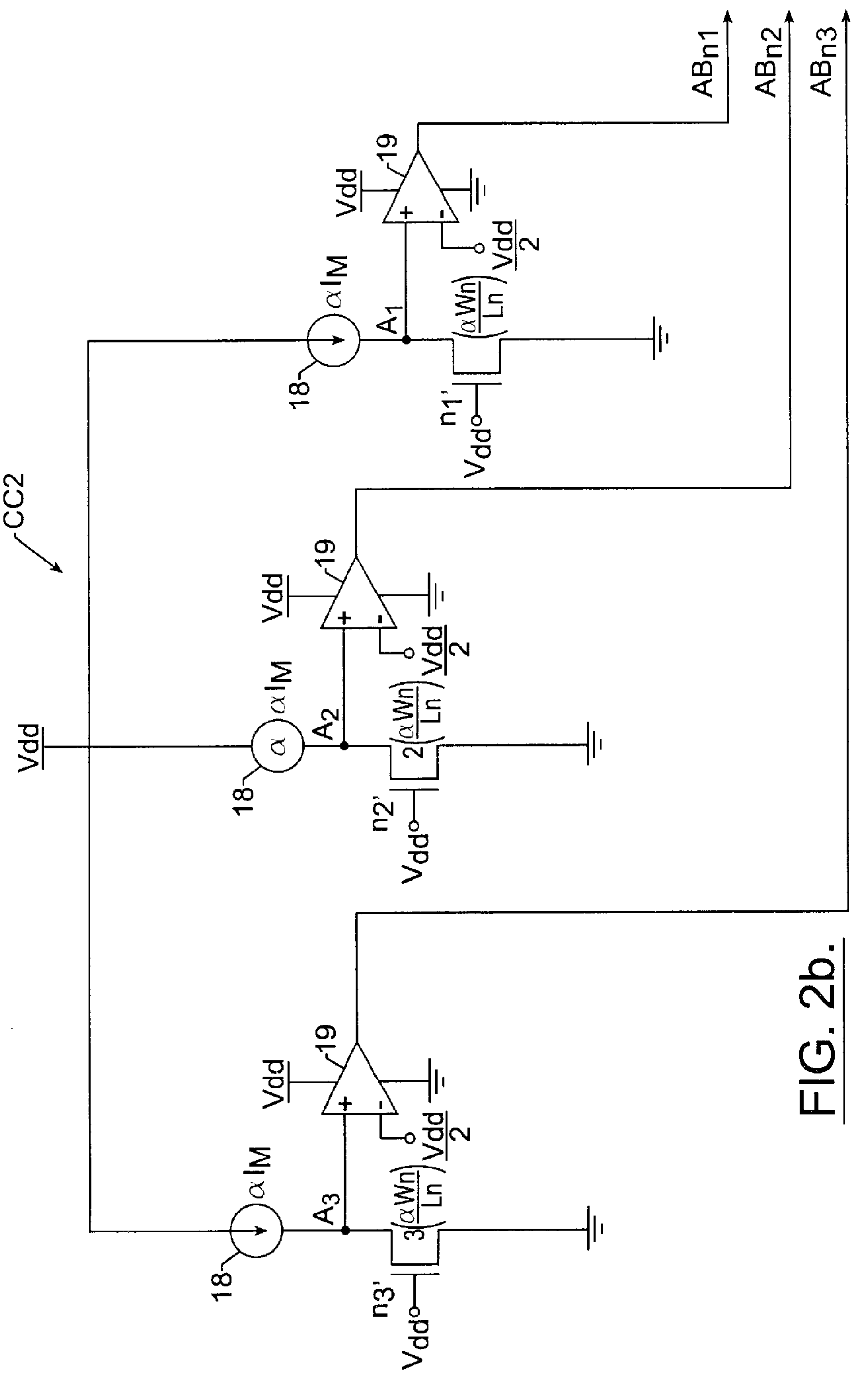
FIG. 2*b* shows a circuit diagram of a second control circuit which can be used in the output driving stage illustrated in FIG. 1.

FIGS. 2*a* and 2*b* respectively show the first and second control circuits CC1 and CC2. The first control circuit CC1 comprises variable impedance means which present a variable impedance correlated to the impedance of the output buffer OB. In particular, the variable impedance means present an impedance variable with the temperature correlated to the variation in the impedance of the output buffer OB.

In the particular example given in FIG. 2*a,* the variable impedance means comprise three control transistors $p'_1$, $p'_2$, $p'_3$, formed by P-channel MOSFET transistors. Each of the control transistors $p'_1$, $p'_2$, $p'_3$ has a resistivity proportional to the equivalent resistivity of a pre-established working configuration of the pull-up circuit PU.

In particular, the control transistor $p_1'$ has a resistivity proportional to the resistivity of the pull-up driver p1 while the control transistors $p_2'$ and $p_3'$ have a resistivity proportional to the equivalent resistivity of the two pull-up drivers $p_1$ and $p_2$ provided in parallel and of the three pull-up drivers $p_1$, $p_2$, $p_3$ provided in parallel respectively. For example, the control transistor $p'_1$ has an aspect ratio $W_{p1}'/L_{p1}'$ equal to the above-described aspect ratio $W_p/L_p$ of the pull-up driver $p_1$ multiplied by a suitable scale factor α: $W_{p1}'/L_{p1}'=\alpha W_p/L_p$.

Moreover, the control transistors $p'_2$ and $p'_3$ have aspect ratios $W_{p2}'/L_{p2}'$, $W_{p3}'/L_{p3}'$ respectively, proportional, according to factor α, to double and triple of the aspect ratio $W_p/L_p$ of the pull-up transistor $p_1$, i.e., equal, respectively, to the double and the triple of the aspect ratio $W_{p1}'/L_{p1}'$ of the control transistor $p_1'$: $W_{p2}'/L_{p2}'=2(\alpha W_p/L_p)$; $W_{p3}'/L_{p3}'=3(\alpha W_p/L_p)$.

Advantageously, the factor α is less than 1 so that the size of the control transistors is less than those of the pull-up drivers so as to obtain a smaller first control circuit CC1 and to ensure that the current flowing therein is not too high.

Each control transistor $p'_1$–$p'_3$ is fed at the source terminal with a voltage $V_{dd}$ and has the drain terminal connected to the current generation means 8. The current generation means 8 are suitable to generate a current equal to $\alpha I_M$, where α is the above-defined scale factor and $I_M$, equal to $V_{dd}/2Z_c$, is the amplitude of the output current at the output buffer OB in matching conditions. Furthermore, the current generation means 8 generate a current which remains substantially stable with temperature. A particular example of the means 8 to generate current $\alpha I_M$, remaining stable with the temperature, shall be described more in detail below.

Moreover, the size of the conduction channels of the control transistors $p'_1$–$p'_3$ described above and the choice of the current value $\alpha I_M$ make it possible to obtain, across each control transistor $p'_1$–$p'_3$, a potential drop substantially equal to the potential drop which would take place across the pull-up driver $p_1$, across the pull-up drivers in parallel $p_1$ and $p_2$ and across the pull-up drivers in parallel $p_1$, $p_2$ and $p_3$ respectively, in impedance matching conditions.

The drain terminals of the control transistors $p'_1$, $p'_3$ are connected, respectively, at the nodes $A_1$, $A_2$ and $A_3$, to three inverting inputs, of three comparators 9, for example, supplied with the voltage $V_{dd}$. Each comparator 9 is provided with a non-inverting input to which is applied a voltage $V_{dd}/2$ equal to half of the supply voltage $V_{dd}$. The voltage $V_{dd}/2$ applied to each comparator 9 is substantially equal to the value $V_i$ of the amplitude of the voltage edge incident on the data line 3 during switching of the output signal from the buffer OB, and when impedance matching conditions are established.

The comparators 9 compare the voltages $V_{A1}$, $V_{A2}$, $V_{A3}$ of the nodes $A_1$, $A_2$, $A_3$ with the voltage $V_{dd}/2$ to provide the signals $AB_{p1}$, $AB_{p2}$, $AB_{p3}$ at the respective outputs. The comparators 9 are a particular example of control means which can be used to generate the signals $AB_{p1}$, $AB_{p2}$, $AB_{p3}$ based on the voltages $V_{A1}$, $V_{A2}$, $V_{A3}$.

Each signal $AB_{p1}$, $AB_{p2}$, $AB_{p3}$ has a voltage level corresponding to a high logic level (e.g., equal to voltage $V_{dd}$) or to a low logic level (e.g., equal to ground voltage GND) if each voltage $V_{A1}$, $V_{A2}$, $V_{A3}$ is lower or greater than the voltage $V_{dd}/2$ respectively.

FIG. 2*b* shows the second control circuit CC2 which is similar to the first control circuit CC1 described above. The second control circuit CC2 comprises variable impedance means of the same type as those described above with reference to FIG. 2*a.*

In the example given in FIG. 2*b,* the variable impedance means comprise three control transistors $n'_1$, $n'_2$, $n'_3$, composed of N-channel MOSFET transistors. Each of the control transistors $n'_1$, $n'_2$, $n'_3$ has a resistivity proportional to the resistivity of a pre-established working configuration of the pull-down circuit PD. In particular, the resistivity and characteristic size, i.e., the size of the conduction channels, of the control transistors $n'_1$–$n'_3$ are correlated to those of the pull-down drivers $n_1$–$n_3$ in the same way as that described with reference to the first control circuit CC1. For example, the characteristic size of the control transistors $n'_1$–$n'_3$ and that of the pull-down drivers $n_1$–$n_3$ are correlated by a scale factor, which is advantageously the above-described factor α.

The source terminals of the control transistors $n'_1$–$n'_3$ are connected to the ground terminal GND, and the drain terminals are connected to the current generation means 18, similar to the means 8 mentioned above and suitable to generate a current $\alpha I_M$. The drain terminals of the control transistors $n'_1$–$n'_3$ are connected, respectively, at nodes $A_1$, $A_2$ and $A_3$, with three non-inverting inputs of three differential comparators 19, for example, supplied with the voltage $V_{dd}$. Each comparator 19 has an inverting input to which is applied a voltage $V_{dd}/2$.

The comparator 19 compares the voltages $V_{A1}$, $V_{A2}$, $V_{A3}$, with the voltage $V_{dd}/2$ to generate the enabling signals $AB_{n1}$, $AB_{n2}$, $AB_{n3}$ on the respective outputs. Each signal $AB_{n1}$, $AB_{n2}$, $AB_{n3}$ has a voltage level corresponding to a high logic level (e.g., equal to the voltage $V_{dd}$) or to a low logic level (e.g., equal to the ground voltage GND) if each voltage $V_{A1}$, $V_{A2}$, $V_{A3}$ is greater or lower than the voltage $V_{dd}/2$ respectively.

A particular example of the operation of the controlled impedance output driving circuit 1 is given below. Suppose that a high logic level signal (bit 1) is applied at the data input IN. In this case, the output signals $ab_{n1}$–$ab_{n3}$ at the logic gates 7 of the AND type have a low logic level, independently of the logic level of the signals $AB_{n1}$–$AB_{n3}$.

Thus, the pull-down drivers $n_1$–$n_3$, composed in the example of FIG. 1 by N-channel MOSFETs, are disabled.

Furthermore, consider an initial state where, at a pre-established temperature T, the output buffer OB is in an impedance matching configuration. For example, the impedance matching is obtained by enabling only the pull-up drivers $p_1$ and $p_2$ of the output buffer OB. The pull-up drivers $p_1$ and $p_2$ are enabled for conduction of the low logic level signals $ab_{p1}$ and $ab_{p2}$. The pull-up driver $p_3$ is kept disabled by the high logic level signal $ab_{p3}$.

In this initial working condition, a potential drop takes place on the control transistors $p_1$' and $p_2$', through which a temperature stable current $\alpha I_M$ is flowing, which drives the nodes $A_1$ and $A_2$ with voltages $V_{A1}$ and $V_{A2}$ to a voltage lower than the voltage $V_{dd}/2$ in such a way that the high logic level signals $AB_{p1}$ and $AB_{p2}$ are present at the output on the corresponding comparators 9. The potential drop on the control transistor $p'_3$ takes the node $A_3$ to a voltage $V_{A3}$ greater than the voltage $V_{dd}/2$ in such a way that the low logic level signal $AB_{p3}$ is present at the output on the corresponding comparator 9.

The signals $AB_{p1}$, $AB_{p2}$, $AB_{p3}$ inverted by the inverters 5 combine inside the logic gates of the OR type 6 with the signal applied to the data input IN and inverted by the inverter 5'. Thus, the low logic level signals $ab_{p1}$ and $ab_{p2}$ and the high logic level signal $ab_{p3}$ are obtained at the output on the logic gates 6. In this way, the output terminal 2 of the integrated circuit, presumed initially at a low logic level, is driven towards the voltage $V_{dd}$ by the two pull-up drivers $p_1$ and $p_2$. As a result of the matching condition in the switching transient of the transistors $p_1$ and $p_2$, the incident edge $V_i$ has an amplitude equal to $V_{dd}/2$, and reflected waves are not generated on the line.

When the temperature T increases compared to the value T, the resistivity of the drivers used in the output buffer OB, and in particular, of the drivers $p_1$ and $p_2$si, also increases. Increase in the resistivity values can lead the output buffer OB to a condition of non-matching, and induce an increase in the potential drop on the parallel pull-up drivers $p_1$ and $p_2$, which corresponds to a decrease in voltage $V_i$ incident on the data line 3 as compared to the value $V_{dd}/2$.

To restore the matching condition of the new temperature value T, it is necessary to reduce the impedance of the output buffer OB. For example, this can be obtained by also enabling for conduction the pull-up driver $p_3$ in such a way as to obtain an overall impedance of the drivers $p_1$,$p_2$,$p_3$ which satisfies the matching condition.

With reference to the control resistors $p'_1$, $p'_2$, $p'_3$, the increase in temperature to which they are also subjected causes an increase in their respective resistivity values by an amount correlated to the increase sustained by the pull-up drivers $p_1$, $p_2$ and $p_3$.

In greater detail, an increase in the resistance of the control transistors $p'_1$ and $p'_2$ affected by the current $\alpha I_M$, stable with the temperature, corresponds to an increase in the potential drop on the transistors and, therefore, a decrease in the voltages $V_{A1}$ and $V_{A2}$. Thus, the voltages $V_{A1}$ and $V_{A2}$ remain less than the voltage $V_{dd}/2$ and the output signals $AB_{p1}$ and $AB_{p2}$ on the corresponding comparators 9 remain at low logic levels keeping the pull-up drivers $p_1$ and $p_2$ enabled for conduction.

The increase in resistivity of the control transistor $p'_3$, also affected by the current $\alpha I_M$, induces an increase in the potential drop on the transistor. If the increase takes the voltage $V_{A3}$ to a value less than $V_{dd}/2$, switching of the corresponding comparator 9 takes place which will generate a high logic level output signal $AB_{p3}$. The signal $AB_{p3}$, suitably inverted by the inverter 5 and when applied to the corresponding logic gate 6, causes switching of the signal $ab_{p3}$ towards a low logic level. This enables the pull-up driver $p_3$ to restore the impedance matching condition.

Now consider the case where, starting from the above-defined initial condition, a decrease in temperature compared to temperature T occurs, leading to a non-matching condition due to the reduction in the resistivity of the parallel pull-up drivers $p_1$ and $p_2$. Matching can be restored by increasing the impedance of the output buffer OB, for example, by disabling the pull-up driver $p_2$.

Reduction in resistivity of the control transistor $p_2$', caused by the decrease in temperature, corresponds to a reduction in the potential drop on the transistor $p_2$' itself, and therefore, to an increase in the voltage $V_{A2}$. In particular, if the voltage $V_{A2}$ has a value greater than the voltage $V_{dd}/2$, the output signal $AB_{p2}$ from the corresponding comparator 9 switches from a high logic level to a low logic level. The signal $AB_{p2}$, applied to the logic gate circuit LGC, causes switching of the signal $ab_{p3}$ from a low logic level to a high logic level which disables the pull-up driver $p_2$. In the example described, the variations in voltages $V_{A1}$ and $V_{A3}$, induced by reductions in temperature, do not cause variations in the logic levels of the signals $AB_{p1}$ and $AB_{p2}$ as compared to the initial condition. In this way, the impedance matching condition for the new temperature value is reached.

Operation of the output driving stage 1 when a low logic level signal (bit 0 is applied at the data input IN,) disables the pull-up circuit PU and enables the pull-down circuit PD is evident to those skilled in the art based upon the previous description and corresponding figures.

Figure 3:
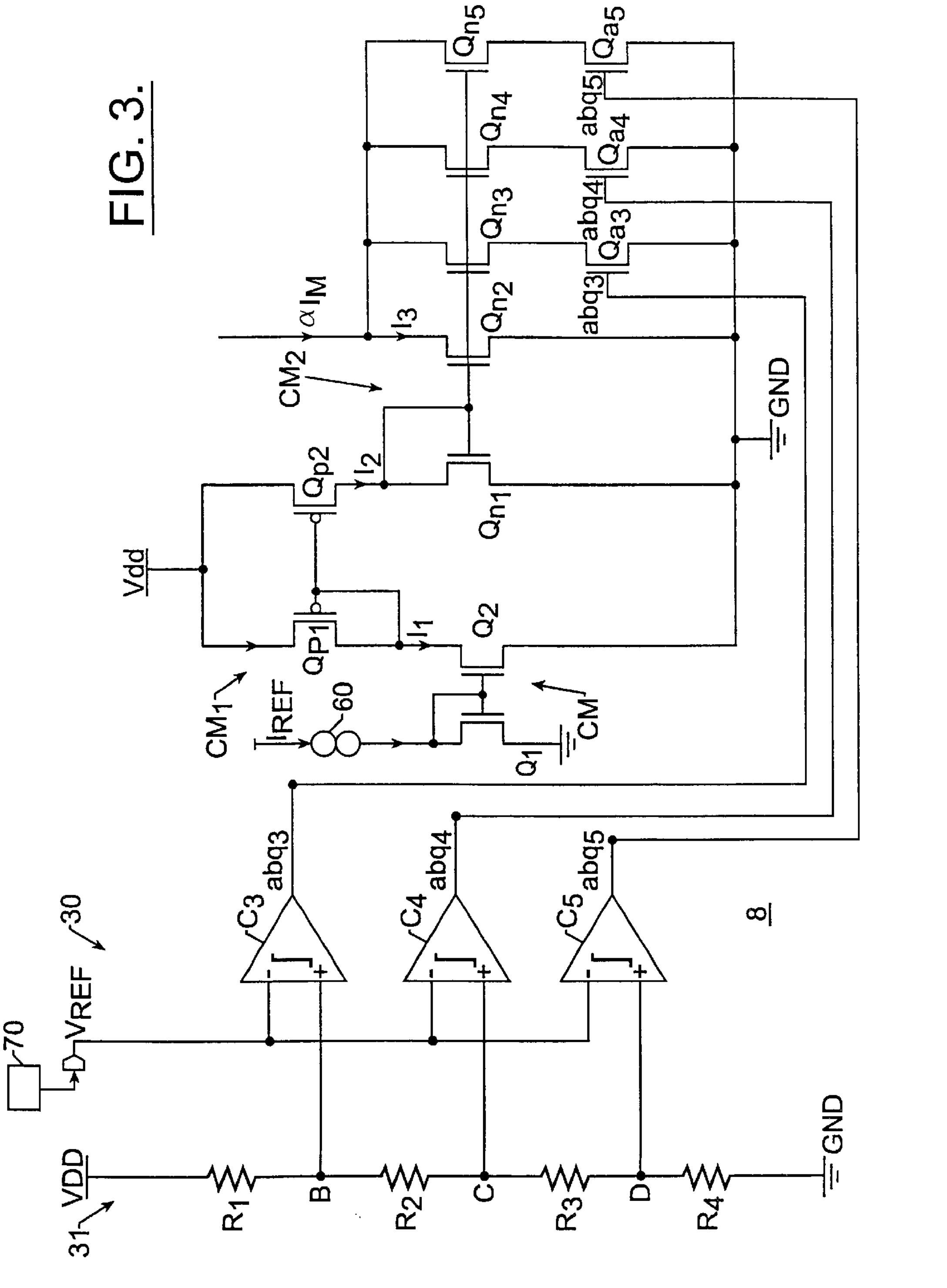
FIG. 3 is a circuit diagram of a particular example of the current generation means which can be used in the output driving stage illustrated in FIG. 1.

FIG. 3 schematically shows a preferred embodiment of the means 8 to generate the current $\alpha I_M$. The means 8 comprise a current source 60 suitable to generate the reference current $I_{REF}$. As stated previously, the source 60 is of a well-known type and, for example, can comprise a voltage generator of the bandgap type. The current source 60 is coupled to current mirror CM comprising a transistor $Q_1$ and a transistor $Q_2$, composed for example, of an N-type MOSFET.

The transistor $Q_1$ has a drain terminal connected to the current source 60 and to its own gate terminal, while a source terminal is connected to ground. The gate terminal of the transistor $Q_1$ is connected to a gate terminal of the transistor $Q_2$. The current mirror CM is suitable to provide at the drain terminal of the transistor $Q_2$ a current $I_1$ proportional to the current $I_{REF}$. Preferably, the transistors $Q_1$ and $Q_2$ have identical aspect ratios, for example, equal to 4 $\mu$m/2 $\mu$m, in such a way so that the current mirror CM absorbs at the drain terminal of the transistor $Q_2$ a current $I_1$ equal to the current $I_{REF}$.

Furthermore, the means 8 comprise a multiplication stage with a first current mirror CM1 and a second current mirror CM2. The first current mirror CM1 comprises two transistors $Q_{p1}$ and $Q_{p2}$, both of the P-channel MOSFET type.

A drain terminal of the transistor $Q_{p1}$ is connected to the drain terminal of the transistor $Q_2$. The transistors $Q_{p1}$ and $Q_{p2}$ are provided with source terminals connected to the supply $V_{dd}$ and with gate terminals connected to each other and to the drain terminal of the transistor $Q_{p1}$. The current mirror CM1 makes it possible to obtain, at the drain terminal of the transistor $Q_{p2}$, a current $I_2$ substantially proportional to the current $I_1$ according to a multiplication factor $k_1$ dependent on the aspect ratios of the transistors $Q_{p1}$ and $Q_2$: $I_2=k_1I_1$.

The first current mirror CM1 is connected to the second current mirror CM2 comprising two transistors $Q_{n1}$ and $Q_{n2}$, both of the N-channel MOSFET type. In particular, a drain terminal of the transistor $Q_{p2}$ is connected to a drain terminal of the transistor $Q_{n1}$ in such a way as to supply the current $I_2$ to the transistor $Q_{n1}$. The transistors $Q_{n1}$ and $Q_{n2}$ have source terminals connected to ground and gate terminals connected to each other, and to the drain terminal of the transistor $Q_{n1}$.

The second current mirror CM2 makes it possible to obtain, at the drain terminal of the transistor $Q_{n2}$, a current $I_3$ entering the drain terminal and proportional to the current $I_2$ according to the multiplication factor $k_2$. In particular, by suitably sizing the first and second current mirrors CM1 and CM2, a current $I_2$ equal to the current $\alpha I_M$ suitable to be used in the first control circuit CC1, is obtained.

Preferably, the current generation means 8 generate a current $\alpha I_M$ which varies in accordance with the supply voltage $V_{dd}$. More preferably, the current $\alpha I_M$ can vary proportionally to the supply voltage $V_{dd}$. In the latter case, the second current mirror CM2 comprises one or more multiplying branches connected in parallel to the transistor $Q_{n2}$ which can be selectively activated by an enabling circuit 30.

In the example given in FIG. 3, three multiplying branches are illustrated, comprising respectively the multiplication transistors of the N-channel MOSFET type $Q_{n3}$, $Q_{n4}$, $Q_{n5}$ and respective branch enabling transistors $Q_{a3}$, $Q_{a4}$, $Q_{a5}$ connected in series to the multiplication transistors. The branch enabling transistors $Q_{a3}$, $Q_{a4}$, $Q_{a5}$ are enabled to conduction by the signals $ab_{q3}$, $ab_{q4}$, $ab_{q5}$, applied respectively to each gate terminal. Enabling of one of the branches makes it possible to modify the current $\alpha I_M$ generated by the means 8. In particular, enabling of a branch causes an increase in the current $\alpha I_M$.

The multiplying branches of the second current mirror CM2 can be enabled by an enabling circuit 30 comprising a resistive divider 31 to which the voltage $V_{dd}$ is applied, and comprising resistances $R_1$–$R_4$ arranged in series. Furthermore, the enabling circuit 30 comprises three comparators $C_3$–$C_5$ having inverting terminals connected to a generator 70 suitable to generate the reference voltage $V_{REF}$ and non-inverting terminals connected to the nodes B, C, D, respectively, of the resistive divider 31. The generator 70 is, for example, a conventional generator of the bandgap type.

The enabling circuit 30 can be manufactured by known integration techniques and, advantageously, it can be entirely provided on the same chip as the output buffer OB. Output of the comparators $C_3$–$C_5$ are connected to the gate terminals of the enabling transistors $Q_{a3}$, $Q_{a4}$, $Q_{a5}$ and they supply the output enabling signals $ab_{q3}$, $ab_{q4}$, $ab_{q5}$ dependent respectively on the difference between the voltages at the points B, C, D and the voltage $V_{REF}$.

For example, consider the particular case in which sizing of the generation means 8 provides that, for a pre-established value of the voltage $V_{dd}$, only the multiplying branch containing the transistor $Q_{n3}$ is activated. In this case, the comparator $C_3$ provides an output signal $ab_{q3}$ with a high logic level and is suitable for enabling the transistor $Q_{a3}$ while the comparators $C_4$, $C_5$ provide the respective output signals $ab_{q4}$, $ab_{q5}$ having a low level so as not to activate the enabling transistors $Q_{a4}$, $Q_{a5}$.

In case of an increase in the voltage $V_{dd}$ compared to the pre-established value for which the entire control circuit CC is sized, an increase in the voltage drop on the resistances $R_1$–$R_4$ is induced. This increase causes the switching of one or both of the comparators $C_4$, $C_5$ in such a way that only the signal $ab_{q4}$ or both signals $ab_{q4}$ and $ab_{q5}$ are of a value sufficiently high to activate either only the transistor $Q_{a4}$ or both transistors $Q_{a4}$ and $Q_{a5}$.

Following enabling of one or more multiplying branches, an increase in the output current $\alpha I_M$ from the means 8 is caused. In the same way, a reduction in the voltage $V_{dd}$ causes disabling of one or more multiplying branches of the second current mirror CM2 and, thus, a reduction in the current $\alpha I_M$.

In particular, suitable sizing of the components of the enabling circuit 30, easily established by those skilled in the art, makes it possible to obtain a current $\alpha I_M$ which varies proportionally to variations in the $V_{dd}$. Preferably, indicating with $V_{dd\text{-}act}$ the value effectively reached by the supply voltage $V_{dd}$, the current $\alpha I_M$ can be made variable as the voltage $V_{dd\text{-}act}$ varies, according to the relation $\alpha I_M = \alpha V_{dd\text{-}act}/2Z_c$.

The possibility of varying the current $\alpha I_M$ according to the voltage $V_{dd}$, and in particular, proportionally to the voltage provided by the multiplying branches and by the enabling circuit 30, makes it possible to render the first control circuit CC1 independent of fluctuations in the voltage $V_{dd}$.

In fact, fluctuation in the voltage $V_{dd}$ compared to the pre-established value, causes the pull-up drivers $p_1$–$p_3$ to be biased in operation points where the output buffer OB is not able to satisfy a matching condition. Therefore, the intersection between the characteristic curve I–V of the output buffer OB and the load line corresponding to the impedance $Z_c$ of the data line 3 determines an operation point with voltage and current values different from the above-mentioned values $V_{dd}/2$, $V_{dd}/2Z$ corresponding to the impedance matching.

To restore the matching condition, it is necessary to modify the configuration of the drivers enabled inside the output buffer OB. By allowing the current $\alpha I_M$ to vary proportionally to the voltage $V_{dd}$, as described with reference to FIG. 3, the drop in potential on the control transistors $p'_1$–$p'_3$ and the voltages $V_{A1}$, $V_{A2}$, $V_{A3}$ are modified in such a way that the comparators 9 provide output enabling signals $AB_{p1}$, $AB_{p2}$, $AB_{p3}$ which change the configuration of the output buffer OB for restoring the matching condition.

For example, with reference to the first control circuit CC1, following an increase in the voltage $V_{dd}$, the circuit 30 suitably increases the output current $\alpha I_M$ for causing an increase in at least one of the voltages $VI_{A1}$, $V_{A2}$, $V_{A3}$ to such a degree as to cause switching of at least one of the comparators 9 resulting in a configuration of the pull-up drivers $p'_1$–$p'_3$ to which an increase in the resistance of the output buffer OB corresponds, such as to restore the buffer to matching conditions. In other words, an increase in the voltage $V_{dd}$ causes a reduction in the resistivity of a control transistor which is compensated by a suitable increase in the current $\alpha I_M$.

With reference to the second control circuit CC2, the means 18 to generate current $\alpha I_M$ to be fed to the drain terminals of the control transistors $n'_1$–$n'_3$ are the same as the above-described generation means 8 used in the control circuit CC1. In particular, to generate a current $\alpha I_M$, a first current mirror can be used, similar to the mirror CM1, including P-channel MOSFET transistors, as well as a second current mirror which, unlike the current mirror CM2, uses P-channel MOSFET transistors. The P-channel MOSFET transistors can be enabled by an enabling circuit similar to the one described above.

The output driving stage 1, and in particular, the control circuit CC, makes it possible to control the impedance of the output buffer OB. This avoids the use of discrete reference circuit components reproducing electrical characteristics of the data line to which the output driving stage is connected, such as temperature stable resistors having a resistance correlated to that of the data line, used according to the known art. The control circuit CC according to the invention has the advantage that it can be integrated onto the same chip as the output buffer OB.

Advantageously, circuit 1 may include additional components, such as auxiliary transistors which can be enabled selectively and set in parallel to the pull-up $p_1$–$p_n$ and pull-down $n_1$–$n_n$ drivers and to the control transistors $p'_1$–$p'_n$ and $n'_1$–$n'_n$ which make it possible to compensate variations, linked to the manufacturing process, in the nominal values and the effective values of the characteristic parameters of the components of circuit 1.

Furthermore, for the same reason, the second current mirror CM2 can include, besides the multiplying branches described above, one or more additional components such as, for example, one or more multiplying branches which can be enabled selectively, of the type similar to those illustrated in FIG. 3. To compensate for variations in the nominal values of the resistors $R_1$–$R_4$, the resistive divider 30 can be provided with additional components, such as, for example, resistances which can be enabled or disabled by controlling suitable transistors set in parallel to the resistances.

By carrying out tests on the circuit 1, it is possible to identify those components, such as the control transistors, output buffer drivers, multiplying branches or resistors, which have characteristics different from the nominal ones. Following the testing stage, optimal configuration of the additional components, which makes it possible to compensate the above-described variations, can be established.

Information relative to the configuration can be stored in suitable non-volatile memory cells, such as CAM (content addressable memory) cells provided for this purpose. Moreover, the presence of additional components makes it possible to obtain impedance matching of the circuit shown in FIG. 1 for different impedance values of the data line 3.

The output driving circuit with controlled impedance according to the invention may have a configuration different to that of the circuit 1 described with reference to FIGS. 1–3. For example, the output buffer OB of the inverting type may include pull-up and pull-down drivers with aspect ratios correlated to each other in a different way from that described as an example previously.

In this regard, consider an output buffer OB of a type alternative to the buffer described previously and including a pull-up circuit provided with a plurality of pull-up drivers, for example, four drivers $P_0$, $P_1$, $P_2$, $P_3$, (not shown) having respective aspect ratios that are multiples of a reference aspect ratio $W_u/L_u$ according to factors in geometric progression of 2: $W_u/L_u$, $2W_u/L_u$, $4W_u/L_u$, $8W_u/L_u$.

The output buffer further comprises a pull-down circuit including a plurality of drivers, for example, four drivers $N_0$, $N_1$, $N_2$, $N_3$, (not shown) having respective aspect ratios that are multiples of a reference aspect ratio $W_u'/L_u'$ according to a relation similar to that described above for the pull-up drivers.

Figure 5:
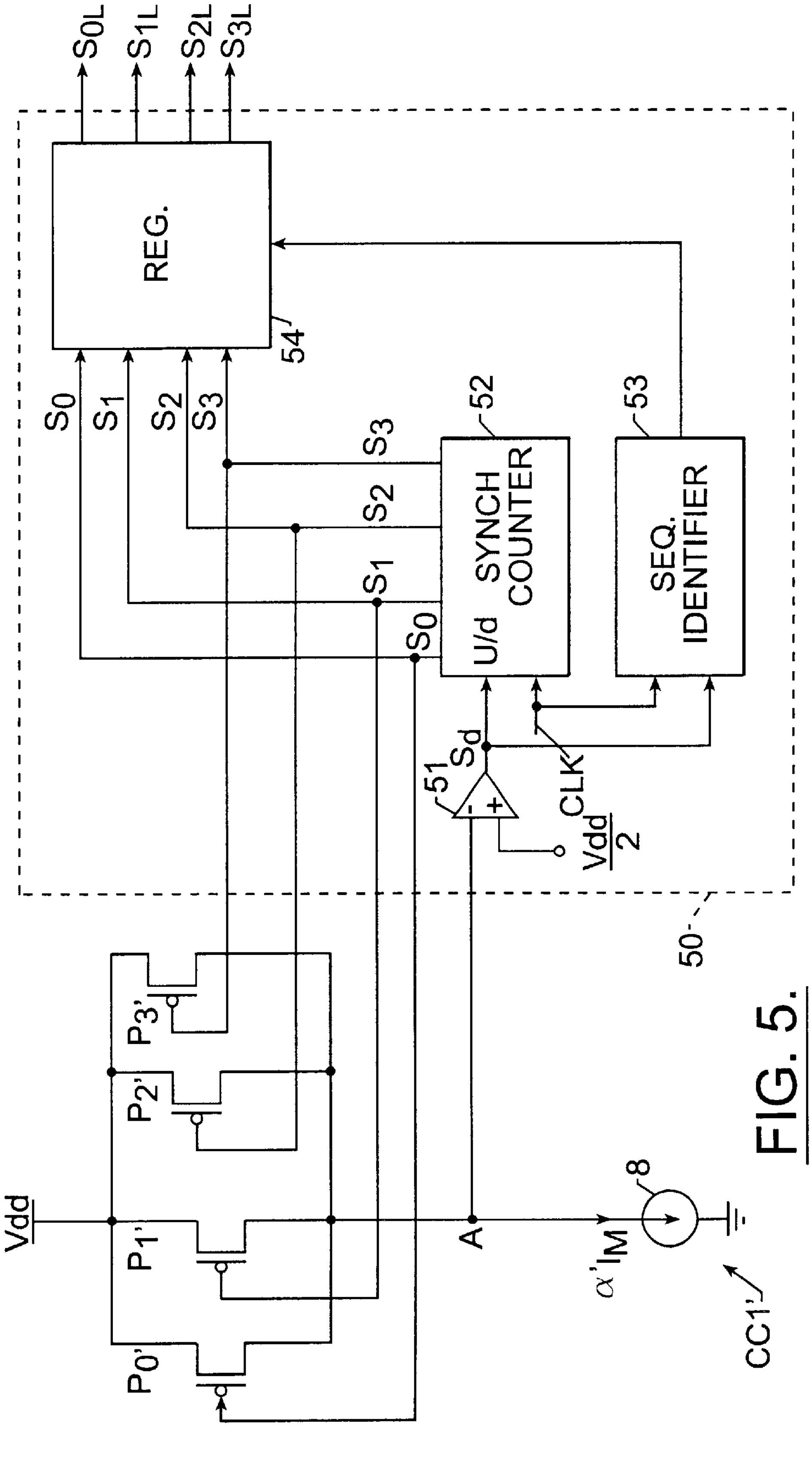
FIG. 5 is a circuit diagram of a control circuit that is an alternative to the circuit diagrams illustrated in FIGS. 2*a*, 2*b*.

The pull-up drivers $P_0$–$P_3$ and the pull-down drivers $N_0$–$N_3$ can, for example, be composed of P-channel and N-channel MOSFETs respectively, and enabled by respective enabling/disabling signals applied to their respective gate terminals. FIG. 5 schematically illustrates a control circuit CC1' suitable to control the pull-up circuit of the output buffer alternative to the buffer described with reference to FIGS. 1–3.

Similarly, to control circuits CC1 and CC2, the control circuit CC1' comprises variable impedance means which have an impedance variable with temperature correlated to the variation in the temperature of the output buffer impedance. In the particular example given in FIG. 5, the variable impedance means comprise four control transistors $P_0'$, $P_1'$, $P_2'$, $P_3'$ composed of P-channel MOSFETs, connected in parallel and supplied with the voltage $V_{dd}$. Each control transistor $P_0'$–$P_3'$ has an aspect ratio equal, respectively, to the aspect ratio of each pull-up driver $P_0$–$P_3$ multiplied by a scale factor $\alpha'$, which is preferably less than 1.

The parallel circuit formed by the control transistors $P_0'$–$P_3'$ is connected to the means 8 to generate current equal to $\alpha' I_M$, where $\alpha'$ is the above-defined scale factor, and $I_M$, equal to $V_{dd}/2Z_c$, is the amplitude of current provided by the output buffer in matching conditions. The means 8 in FIG. 5 are similar to the means 8 described with reference to FIG. 3.

Each control transistor $P_0'$–$P_3'$ is enabled by respective enabling/disabling signals $s_0$, $s_1$, $s_2$, $s_3$ applied to the respective gate terminals. The control circuit CC1' further comprises control means, such as a control circuit 50 suitable to generate signals $s_{0L}$, $s_{1L}$, $s_{2L}$, $s_{3L}$ from which the enabling/disabling signals of the pull-up drivers $P_0$–$P_3$ can be obtained. Furthermore, the control circuit 50 generates the enabling/disabling signals $s_0$, $s_1$, $s_2$, $s_3$ of the control transistors $P_0'$–$P_3'$.

In greater detail, the control circuit 50 comprises a comparator 51, similar to the comparators 9 described previously, having a first input connected to a node A (which is connected to the drain terminals of the control transistors $P_0'$–$P_3'$), a second input to which the voltage $V_{dd}/2$ can be applied, and an output for a signal $s_d$ having a voltage level of a logic level depending on the difference between the signals applied to the first and second inputs.

The output providing the signal $s_d$ is connected to the input of a synchronous counter 52 module 16, of the bi-directional or up/down type, to which a timing or clock pulse sequence CLK can be fed. This counter 52, based on the logic level of the signal $s_d$, increases or decreases a unit with each clock pulse. The signal $s_d$ has the role of a counter direction signal for the counter 52.

Corresponding to each counter state in which it operates, the counter 52 outputs the four enabling/disabling signals $s_0$, $s_1$, $s_2$, $s_3$ of the control transistors $P_0'$–$P_3'$. Each output $s_i$ of the counter 52 corresponds to a bit of the binary digit which increases or decreases during the count.

The output of the comparator 51 is also connected to a sequence identifier 53 provided with an input for the pulse train of the clock CLK. The sequence identifier 53 provides, at one of its outputs, an identifying signal with a high logic level when the signal $s_d$ applied to one of its inputs is given by a suitable bit sequence, for example, a sequence of the type 10101010 . . . and of the type 11001100 . . . . These two sequences correspond to two possible stable states in which the voltage VA oscillates around the value $V_{dd}/2$.

The outputs of the counter 52 with the enabling/disabling signals $s_0$, $s_1$, $s_2$, $s_3$ are connected to a register 54. The register 54 is also connected to the output of the sequence identifier 53 whose identifying signal acts as a sync signal for the register. The register 54 keeps outputting the signals $s_{0L}$, $s_{1L}$, $s_{2L}$, $s_{3L}$ and samples the input signals $s_0$, $s_1$, $s_2$, $s_3$ supplying them at the output at a rising edge of the sync signal coming from the sequence identifier 53.

During operation, when the voltage $V_A$ of point A is less than the voltage $V_{dd}/2$, the signal $s_d$ output by the comparator 9 is at a high logic level, in such a way as to set the counter 52 in a particular clock pulse counting direction, for example, forward or up counting. At the output of the counter 52, the signals $s_0$, $s_1$, $s_2$, $s_3$ take on logic levels to enable and/or disable at least one of the control transistors $P_0'$–$P_3'$ to increase the voltage $V_A$. If the voltage remains at a value less than the voltage $V_{dd}/2$, counting continues in the same direction, while if the voltage $V_A$ is greater than the voltage $V_{dd}/2$, the signal $s_d$ switches which inverts the count direction.

When a state is reached in which the voltage $V_A$ is adequately near the voltage $V_{dd}/2$, the signal $s_d$ takes the course of one of the sequences identifiable by the sequence identifier 53. After a pre-established number of clock pulses, the sequence identifier 53 switches, providing at the output a high logic level signal. The switching ensures that the register 54 provides the output signals $s_{0L}$, $s_{1L}$, $s_{2L}$, $s_{3L}$ at logic levels equal to those of the signals $s_0$, $s_1$, $s_2$, $s_3$ at the output from the counter 52. The signals $s_{0L}$, $s_{1L}$, $s_{2L}$, $s_{3L}$ so obtained make it possible to impose a configuration of the output buffer corresponding to the matching.

Figure 4:
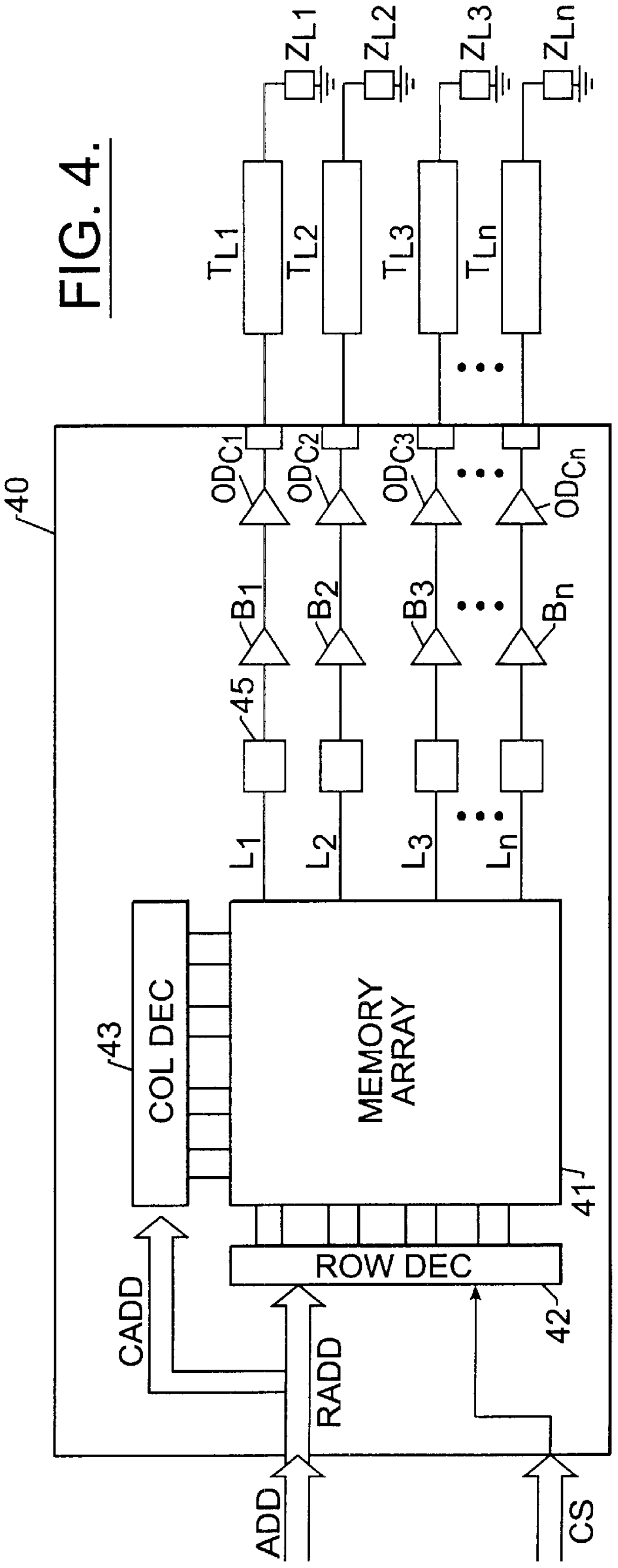
FIG. 4 is a functional block diagram of a particular example of an integrated circuit using the output driving stage illustrated in FIG. 1.

FIG. 4 illustrates an integrated circuit or chip 40 supplied with a voltage $V_{dd}$ and comprising a memory array 41, such as a non-volatile memory of the Flash type, including a plurality of memory cells arranged in rows and columns suitable for storing bits. The memory array 41 is provided with a row decoder 42 and a column decoder 43 suitable to receive, through suitable buses, a row address signal RADD and a column address signal CADD respectively, both fed at an ADD input of the chip 40.

Based on the address signals RADD and CADD, the row and column decoders 42 and 43 make it possible to select one or more rows and one or more columns respectively of the memory array 41 to select a number n of cells of the memory array 41. Furthermore, the chip 40 is provided with an input CS for the application of control signals of the memory array 41. For example, the control signals may comprise a read enabling signal OE, a write enabling signal WE and a circuit enabling signal CE.

The memory array 41 is connected to n output lines $L_1$–$L_n$ on which, during a reading operation of the array itself, n data bits are made available, and stored in the selected memory cells. These output lines 44 are connected to n sense amplifiers 45 of a conventional type, for example. The sense amplifiers 45 are connected to n output driving circuits with controlled impedance ODC1–ODCn, each of a type similar to circuit 1 described above.

The circuits ODC1–ODCn are connected by terminals 2, which are typically pads, to respective data lines $T_{L1}$–$T_{Ln}$, with characteristic impedance $Z_{c1}$–$Z_{cn}$, each closed on an impedance load $Z_{L1}$–$Z_{Ln}$ such as to operate as an open circuit. The data lines $T_{L1}$–$T_{Ln}$ form a bus for the transmission of data output from the memory array 41, produced for example on a printed circuit on which the chip 40 is applied. The impedance loads $Z_{L1}$–$Z_{Ln}$ can, for example, together represent a microprocessor input circuit.

Similar to circuit 1, the circuits ODC1–ODCn comprise output buffers of a type similar to the above-described output buffer OB and respective control circuits similar to the above-described circuit CC. Preferably, a single control circuit, similar to circuit CC can be used to control all the output buffers of the ODC1–ODCn circuits.

Each circuit ODC1–ODCn is such as to control the impedance matching of the respective output buffers. In other words, each circuit ODC1–ODCn makes it possible to control the impedance of the output buffer contained therein in such a way as to maintain it substantially equal to the impedance of the respective data lines $T_{L1}$–$T_{Ln}$.

A reduction in the power used to manage the matching impedance control can be obtained by activating the control circuit present in each circuit ODC1–ODCn only in some stages of the operation of the integrated circuit. For example, the control circuits can be activated before each reading step of the data stored in the memory 41 in such a way as to modify or leave unchanged the configuration of the pull-up and pull-down drivers enabled inside the output buffers with the aim to reach or maintain the matching state. Similar to circuit 1, each circuit ODC1–ODCn is sized in such a way as to obtain matching with reference to a pre-established impedance $Z_{c1}$–$Z_{cn}$ of the data line $T_{L1}$–$T_{Ln}$.

Obviously, those skilled in the art, with the aim of satisfying contingent and specific requirements, can make numerous modifications and variations to the control circuit and to the output driving circuit described herein, all of which are within the protective scope of the invention as defined in the claims below.

That which is claimed is:

1. An impedance control circuit for controlling an impedance of an integrated output driving stage comprising at least one enabling/disabling transistor and at least one driving transistor, the impedance control circuit comprising:

a variable impedance circuit having an impedance that varies with temperature in correlation with the impedance of the output driving stage;

a control circuit connected to said variable impedance circuit for generating at least one enabling/disabling signal for the at least one enabling/disabling transistor based on a control signal correlated to the impedance of said variable impedance circuit; and a current generating circuit for applying to said variable impedance circuit a current which remains substantially stable as the temperature varies.

2. An impedance control circuit according to claim 1 wherein the control signal is also correlated to a voltage drop in said variable impedance circuit determined by the generated current.

3. An impedance control circuit according to claim 1 wherein said current generating circuit comprises a current source for generating a reference current that remains substantially stable as the temperature varies and as a supply voltage varies.

4. An impedance control circuit according to claim 3 wherein said current generating circuit further comprises a multiplication circuit connected to said current source; and wherein said multiplication circuit comprises at least one current mirror for multiplying the reference current by a multiplication factor and for obtaining the current which remains substantially stable as the temperature varies.

5. An impedance control circuit according to claim 4 further comprising an intermediate current mirror between said current source and said multiplication circuit for supplying said multiplication circuit with a current proportional to the reference current.

6. An impedance control circuit according to claim 4 wherein said at least one current mirror comprises:

a first current mirror having a first current multiplying factor; and a second current mirror connected to said first mirror for multiplying by a second multiplication factor a current coming from said first mirror and for providing the current that remains substantially stable as the temperature varies.

7. An impedance control circuit according to claim 1 wherein said control circuit comprises a comparator having a first input for receiving the control signal and a second input for receiving a reference signal, and an output for supplying a difference signal based upon a difference between the control signal and the reference signal, the difference signal being the at least one enabling/disabling signal.

8. An impedance control circuit according to claim 7, further comprising a counting device for bi-directionally counting timing pulses, said counting device having an input terminal connected to the output of said comparator for receiving a counting direction control signal, and at least one counting output connected to said variable impedance circuit for supplying counting signals thereto for varying the impedance thereof.

9. An impedance control circuit according to claim 8 further comprising:

a register for storing the counting signals, said register being activated by an activation signal for supplying the at least one enabling/disabling signal; and a sequence identifier connected between said comparator and said register for identifying a sequence of the counting signals and for providing the activation signal to said register.

10. An impedance control circuit according to claim 1 wherein said variable impedance circuit comprises at least one control transistor.

11. An impedance control circuit according to claim 4 wherein said variable impedance circuit has an impedance that varies with the supply voltage according to the impedance of the output driving stage and a current that remains substantially as the temperature varies, the current being variable in correlation to the supply voltage.

12. An impedance control circuit according to claim 11 wherein the current varies proportionally to the supply voltage; and wherein said at least one current mirror comprises a plurality of multiplication branches that are selectively enabled for modifying the current proportional to the supply voltage.

13. An impedance control circuit according to claim 12 further comprising an enabling circuit connected to each multiplication branch for generating a plurality of enabling/disabling signals based upon the supply voltage and a reference voltage that remains substantially stable as the temperature varies and as the supply voltage varies.

14. An impedance control circuit according to claim 13 wherein said enabling circuit comprises:

a resistive divider comprising a plurality of resistors for receiving the supply voltage; and a plurality of comparators, each comparator having a first input connected to one of said plurality of resistors, a second input for receiving the reference voltage, and an output connected to a multiplication branch for supplying a signal corresponding to one of the plurality of enabling/disabling signals.

15. An impedance control circuit according to claim 12 wherein each multiplication branch comprises a branch enabling transistor and a multiplication transistor serially connected therewith.

16. An integrated circuit comprising:

an output driving circuit comprising at least one enabling/disabling transistor and at least one driving transistor for providing an output signal; and an impedance control circuit connected to said output driving circuit for supplying at least one enabling/disabling signal to said at least one enabling/disabling transistor, said impedance control circuit for controlling impedance of said output driving stage and comprising a variable impedance circuit having an impedance that varies with temperature in correlation with the impedance of said output driving stage, a control circuit connected to said variable impedance circuit for generating the at least one enabling/disabling signal for the at least one enabling/disabling transistor based on a control signal correlated to the impedance of said variable impedance circuit, and a current generating circuit for applying to said variable impedance circuit a current which remains substantially stable as the temperature varies.

17. An integrated circuit according to claim 16 wherein said at least one driving transistor comprises a plurality of driving transistors comprising:

a first plurality of pull-up transistors connected in parallel; and a second plurality of pull-down transistors connected in parallel;

each pull-up transistor being connected in series to a respective pull-down transistor.

18. An integrated circuit according to claim 16 wherein said current generating circuit comprises a current source for generating a reference current that remains substantially stable as the temperature varies and as a supply voltage varies.

19. An integrated circuit according to claim 18 wherein said current generating circuit further comprises a multiplication circuit connected to said current source; and wherein said multiplication circuit comprises at least one current mirror for multiplying the reference current by a multiplication factor and for obtaining the current which remains substantially stable as the temperature varies.

20. An integrated circuit according to claim 19 further comprising an intermediate current mirror between said current source and said multiplication circuit for supplying said multiplication circuit with a current proportional to the reference current.

21. An integrated circuit according to claim 19 wherein said at least one current mirror comprises:

a first current mirror having a first current multiplying factor; and a second current mirror connected to said first mirror for multiplying by a second multiplication factor a current coming from said first mirror, and for providing the current that remains substantially stable as the temperature varies.

22. An integrated circuit according to claim 16 wherein said control circuit comprises a comparator having a first input for receiving the control signal and a second input for receiving a reference signal, and an output for supplying a difference signal based upon a difference between the control signal and the reference signal, the difference signal being the at least one enabling/disabling signal.

23. An integrated circuit according to claim 22 further comprising a counting device for bi-directionally counting timing pulses, said counting device having an input terminal connected to the output of said comparator for receiving a counting direction control signal, and at least one counting output connected to said variable impedance circuit for supplying counting signals thereto for varying the impedance.

24. An integrated circuit according to claim 23 further comprising:

a register for storing the counting signals, said register being activated by an activation signal for supplying the at least one enabling/disabling signal; and a sequence identifier connected between said comparator and said register for identifying a sequence of the counting signals and for providing the activation signal to said register.

25. An integrated circuit according to claim 19 wherein said variable impedance circuit has an impedance that varies with the supply voltage according to the impedance of the output driving stage and a current that remains substantially stable as the temperature varies, the current being variable in correlation to the supply voltage.

26. An integrated circuit according to claim 25 wherein the current varies proportionally to the supply voltage, wherein said at least one current mirror comprises a plurality of multiplication branches that are selectively enabled for modifying the current proportional to the supply voltage.

27. An integrated circuit according to claim 26 further comprising an enabling circuit connected to each multiplication branch for generating a plurality of enabling/disabling signals based upon the supply voltage and a reference voltage that remains substantially stable as the temperature varies and as the supply voltage varies.

28. A memory device comprising:

a nonvolatile memory array comprising a plurality of memory cells arranged in rows and columns for storing data therein;

row and column decoders connected to said memory array for selecting at least one memory cell based upon an address signal;

at least one sense amplifier for detecting stored data in said at least one memory cell;

at least one output driving circuit having an input connected to an output of said at least one sense amplifier for receiving the stored data, and an output for providing the stored data to an external data line, said at least one output driving circuit comprising at least one enabling/disabling transistor and at least one driving transistor; and an impedance control circuit connected to said at least one output driving circuit for supplying at least one first enabling/disabling signal to said at least one enabling/disabling transistor, said impedance control circuit for controlling impedance of said at least one output driving stage and comprising a variable impedance circuit having an impedance that varies with temperature in correlation with the impedance of said output driving stage, a control circuit connected to said variable impedance circuit for generating the at least one enabling/disabling signal for the at least one enabling/disabling transistor based on a control signal correlated to the impedance of said variable impedance circuit, and a current generating circuit for applying to said variable impedance circuit a current which remains substantially stable as the temperature varies.

29. A memory device according to claim 23 wherein said at least one driving transistor comprises a plurality of driving transistors comprising:

a first plurality of pull-up transistors connected in parallel; and a second plurality of pull-down transistors connected in parallel;

each pull-up transistor being connected in series to a respective pull-down transistor.

30. A memory device according to claim 28 wherein said current generating circuit comprises a current source for generating a reference current that remains substantially stable as the temperature varies and as a supply voltage varies.

31. A memory device according to claim 30 wherein said current generating circuit further comprises a multiplication circuit connected to said current source; and wherein said multiplication circuit comprises at least one current mirror for multiplying the reference current by a multiplication factor and for obtaining the current which remains substantially stable as the temperature varies.

32. A memory device according to claim 31 further comprising an intermediate current mirror between said current source and said multiplication circuit for supplying said multiplication circuit with a current proportional to the reference current.

33. A memory device according to claim 28 wherein said control circuit comprises a comparator having a first input for receiving the control signal and a second input for receiving a reference signal, and an output for supplying a difference signal based upon a difference between the control signal and the reference signal, the difference signal being the at least one enabling/disabling signal.

34. A memory device according to claim 33 further comprising a counting device for bi-directionally counting timing pulses, said counting device having an input terminal connected to the output of said comparator for receiving a counting direction control signal, and at least one counting output connected to said variable impedance circuit for supplying counting signals thereto for varying the impedance thereof.

35. A memory device according to claim 34, further comprising:

a register for storing the counting signals, said register being activated by an activation signal for supplying the at least one enabling/disabling signal; and a sequence identifier connected between said comparator and said register for identifying a sequence of the counting signals and for providing the activation signal to said register.

36. A method for controlling impedance of an integrated output driving stage comprising at least one enabling/disabling transistor and at least one driving transistor, the method comprising:

providing a variable impedance circuit having an impedance that varies with temperature in correlation with the impedance of the output driving stage;

generating at least one enabling/disabling signal for the at least one enabling/disabling transistor based on a control signal correlated to the impedance of the variable impedance circuit, the at least one enabling/disabling signal being generated using an enabling/disabling circuit connected to the variable impedance circuit; and applying a current to the variable impedance circuit which remains substantially stable as the temperature varies.

37. A method according to claim 36 wherein the current is generated using a current generating circuit comprising a current source for generating a reference current that remains substantially stable as the temperature varies and as a supply voltage varies.

38. A method according to claim 37 wherein the current generating circuit further comprises a multiplication circuit connected to the current source; and wherein the multiplication circuit comprises at least one current mirror for multiplying the reference current by a multiplication factor and for obtaining the current which remains substantially stable as the temperature varies.

39. A method according to claim 38 further comprising an intermediate current mirror between the current source and the multiplication circuit for supplying the multiplication circuit by a current proportional to the reference current.

40. A method according to claim 36 wherein the control circuit comprises a comparator having a first input for receiving the control signal and a second input for receiving a reference signal, and an output for supplying a difference signal based upon a difference between the control signal and the reference signal, the difference signal being the at least one enabling/disabling signal.

41. A method according to claim 40, further comprising a counting device for bi-directionally counting timing pulses, the counting device having an input terminal connected to the output of the comparator for receiving a counting direction control signal, and at least one counting output connected to the variable impedance circuit for supplying counting signals thereto for varying the impedance.

* * * * *

UNITED STATES PATENT AND TRADEMARK OFFICE

CERTIFICATE OF CORRECTION

PATENT NO. : 6,567,318 B2
DATED : May 20, 2003
INVENTOR(S) : Lorenzo Bedarida et al.

It is certified that error appears in the above-identified patent and that said Letters Patent is hereby corrected as shown below:

Title page,
Item [30], insert: -- Foreign Application Priority Data,
Nov. 23, 2000 (IT)............MI2000A002529

Column 8,
Line 63, delete "$Q_2$:" insert -- $Q_{p2}$: --

Column 10,
Line 43, delete "$VI_{A1}$," insert -- $V_{A1}$, --

Column 15,
Line 29, delete "substantially as" insert -- substantially stable as --

Column 17,
Line 58, delete "Claim 23" insert -- Claim 28 --

Signed and Sealed this

Eleventh Day of November, 2003

JAMES E. ROGAN
*Director of the United States Patent and Trademark Office*